United States Patent [19]

Inogai et al.

[11] Patent Number: 5,327,092
[45] Date of Patent: Jul. 5, 1994

[54] SWITCHED CAPACITOR FILTER CIRCUIT EMPLOYING TWO SWITCHED CAPACITOR FILTERS

[75] Inventors: Kazunori Inogai; Yoshiaki Shinagawa; Kouichi Honma, all of Yokohama, Japan

[73] Assignee: Matsushita Elecric Industrial Co., Ltd., Osaka, Japan

[21] Appl. No.: 853,794

[22] Filed: Mar. 19, 1992

[30] Foreign Application Priority Data

Apr. 11, 1991 [JP] Japan .................. 3-079184

[51] Int. Cl.⁵ .................. H03K 5/00; H03K 5/159
[52] U.S. Cl. .................. 328/167; 328/151; 307/521; 307/353
[58] Field of Search .................. 307/520, 352, 353; 328/151, 167, 127, 165

[56] References Cited

U.S. PATENT DOCUMENTS

| | | | |
|---|---|---|---|
| 4,366,456 | 12/1982 | Ueno et al. | 328/151 |
| 4,375,625 | 3/1983 | Lee | 328/167 |
| 4,546,324 | 10/1985 | Bingham et al. | 328/151 |
| 4,644,304 | 2/1987 | Temes | 328/151 |
| 4,849,662 | 7/1989 | Holberg et al. | 328/167 |
| 4,908,579 | 3/1990 | Tawfik et al. | 328/167 |

Primary Examiner—Timothy P. Callahan
Assistant Examiner—Trong Phan
Attorney, Agent, or Firm—Stevens, Davis, Miller & Mosher

[57] ABSTRACT

A switched capacitor filter circuit which enables easy adjustment of a post-filter circuit to reduce the power consumption of a switched capacitor filter at a main side. In the switched capacitor filter circuit, a plurality of capacitors having capacitive values weighted by interpolating operation coefficients are provided, and a second SCF, operated at a sufficiently high sampling frequency to suppress unnecessary frequency components through a lower-order analog filter, is used as a post-filter. Further an output of a first SCF at the main side is simultaneously stored in the plurality of capacitors at in the form of charges stored therein so that the charges are sequentially extracted at equi-intervals of a sampling frequency higher than that of the first SCF to perform non-cyclic filtering operation, whereby higher-order interpolating operation of an output of the first SCF is carried out to suppress unnecessary frequency components corresponding to a multiple of the sampling frequency contained in the first SCF output.

1 Claim, 10 Drawing Sheets

SWITCHED CAPACITOR FILTER CIRCUIT EMPLOYING TWO SWITCHED CAPACITOR FILTERS

BACKGROUND OF THE INVENTION

The present invention generally relates to a switched capacitor filter (which will be sometimes referred to merely as the SCF, hereinafter) which is used in a modulator or the like for a digital mobile radio telephone system or a digital portable telephone. The present invention also relates to a circuit which employs the SCF.

FIG. 1 schematically shows an arrangement of a prior art SCF circuit. The SCF circuit of the drawing includes an analog signal input terminal 201, a clock input terminal 202, a clock generator 203, an SCF 204, a sample holding circuit 205, a low pass type analog filter 206 and an analog signal output terminal 207.

The operation of the above prior art SCF circuit will be explained. The SCF circuit operates in such a manner that its output spectrum has such a route Nyquist characteristic ($\alpha=0.5$) as shown in the following equation (1) with respect to a 21 kHz rectangular pulse train input.

$$H(f) = \begin{cases} 1 & (0 \leq f < 5.25 \text{ k}) \\ \left\{ \left( 0.5 \times \left( 1 - \sin\left[ \pi \left( \frac{f}{10.5 \text{ k}} - 1 \right) \right] \right) \right) \right\}^{0.5} & (5.25 \text{ k} \leq f < 15.75 \text{ k}) \\ 0 & (15.75 \text{ k} < f) \end{cases} \quad (1)$$

In FIG. 1, a system clock having a frequency of 5.376 MHz is applied to the clock input terminal 202 and the clock generator 203 generates clock signals necessary for the operation of the SCF 204 and sample holding circuit 205 on the basis of the system clock received from the input terminal 202.

When a 21 kHz rectangular pulse train is applied to the analog signal input terminal 201, the SCF 204 samples the amplitude value of the received analog input signal at 336 kHz, fetches therein and then performs its filtering operation. Further, an output of the SCF 204 is held at the sample holding circuit 205 with respect to 0-the order to have such an output waveform as shown in FIG. 2.

The 0-th-held output spectrum, which expressed by the following equation (2), contains unnecessary frequency components which have frequencies corresponding to a multiple of the sampling frequency 336 kHz as shown in FIG. 3.

$$\| Hz(f) \|^2 = \frac{\sin[\pi f]}{\pi f} \times \sum_{j=0}^{\infty} \| H(f - j \times fs) \|^2 \quad (2)$$

where fs = 336 kHz.

The analog filter 206, which has a third-order Butterworth characteristic with a cut-off frequency of 50 kHz, suppresses the aforementioned unnecessary spectrum components and then outputs it to the analog output terminal 207. An example of the analog filter 206 is shown in FIG. 4.

However, the above prior art SCF circuit has had such a problem that such an analog filter having a low cut-off frequency and an abrupt characteristic as shown in FIG. 4 is indispensable as a post-filter. This makes it difficult to make the SCF circuit in the form of an integrated circuit (IC) to eliminate the need for any adjustment.

Further, when the circuit is simplified by reducing the pass frequency order of the post-filter, the sampling frequency must be set to be high, which undesirably increases the power consumption of the SCF of the main side (with respect to the post-filter).

SUMMARY OF THE INVENTION

It is an object of the present invention to provide an excellent switched capacitor filter for a post-filter which allows easy adjustment of a post-filter circuit.

Another object of the present invention is to provide an excellent switched capacitor filter circuit which can reduce the sampling frequency of the main side of the SCF to thereby realize a low power consumption.

In accordance with the present invention, in order to attain the above objects, a plurality of capacitors having capacitive values weighted by interpolating operation coefficients are provided, and a second SCF, operated at a sufficiently high sampling frequency to suppress unnecessary frequency components through a lower-order analog filter, is used as a post-filter. Also an output of a first SCF at the main side is stored in the plurality of capacitors at the same time in the form of charges stored therein so that the charges are sequentially extracted at equi-intervals of a sampling frequency higher than that of the first SCF to perform non-cyclic filtering operation, whereby higher-order interpolating operation of an output of the first SCF is carried out to suppress unnecessary frequency components corresponding to a multiple of the sampling frequency contained in the first SCF output.

Accordingly, in accordance with the present invention, since the second SCF, operated at the sufficiently high sampling frequency as the post-filter, carries out its high-order interpolating operation over the output of the first SCF at the main side to suppress the unnecessary frequency components, it is ultimately required that the low-order analog filter suppress unnecessary frequency components corresponding to a multiple of the high sampling frequency, whereby no adjustment of the circuit and low power consumption thereof can be realized.

DESCRIPTION OF THE PREFERRED EMBODIMENTS

Figure 1:
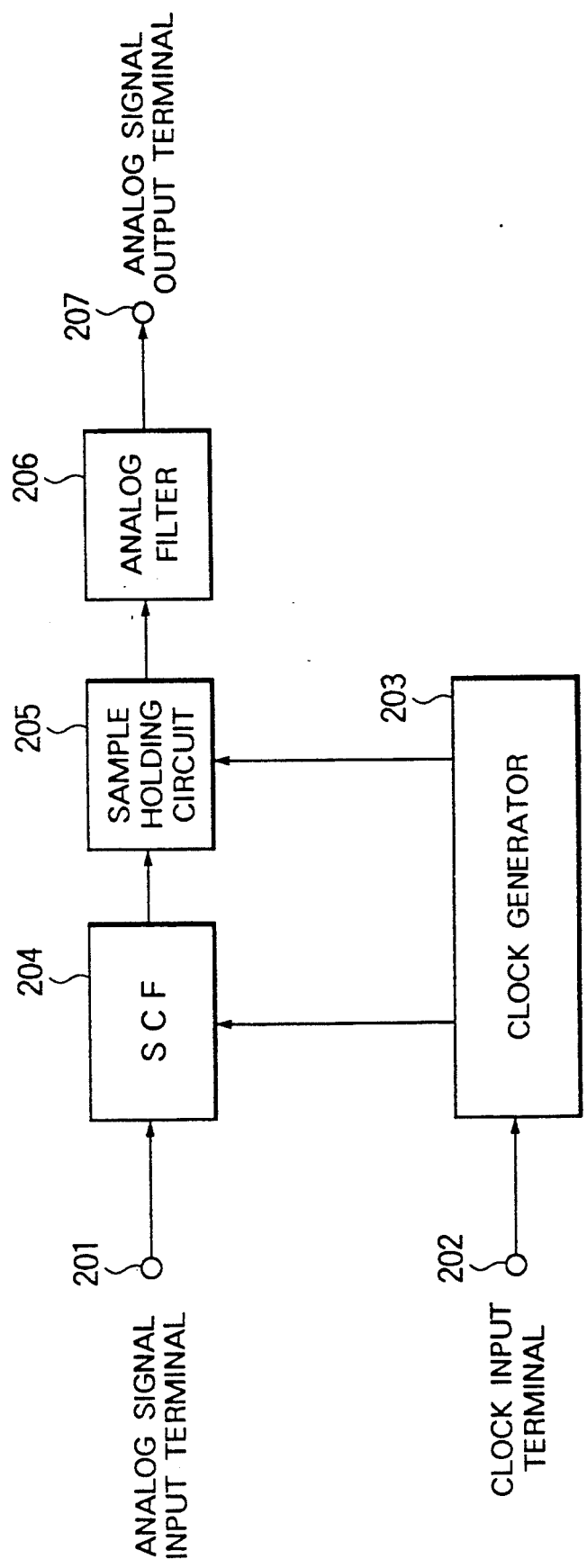
FIG. 1 is a block diagram of a prior art SCF circuit.
Figure 2:
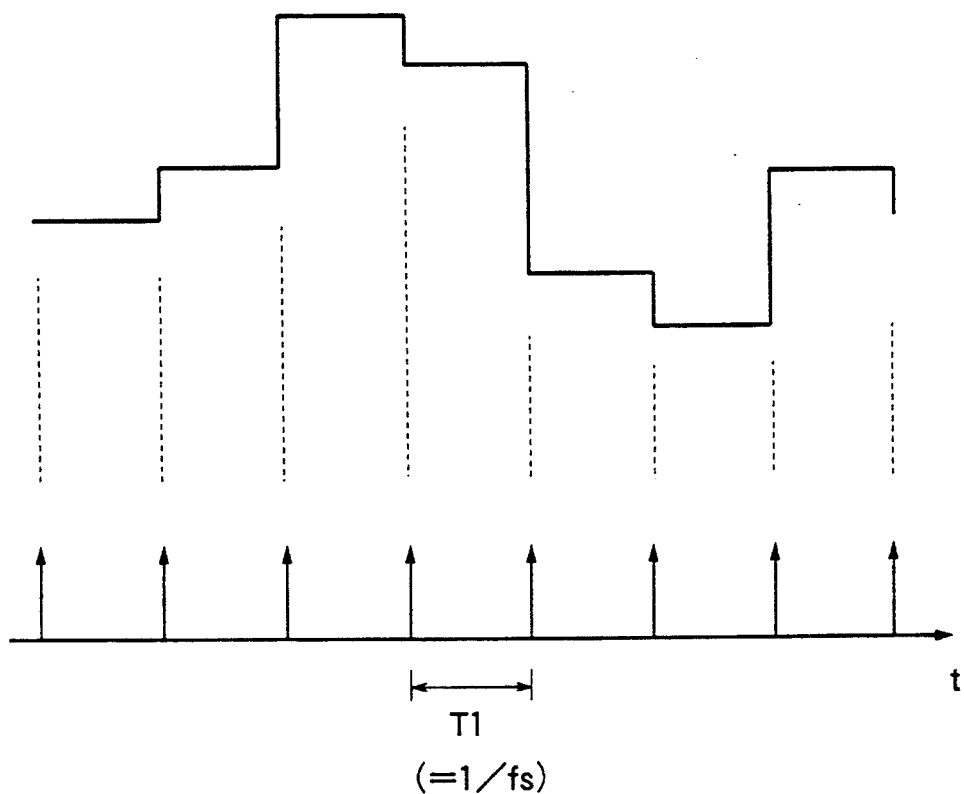
FIG. 2 is a waveform of a sample-held output in the prior art.
Figure 3:
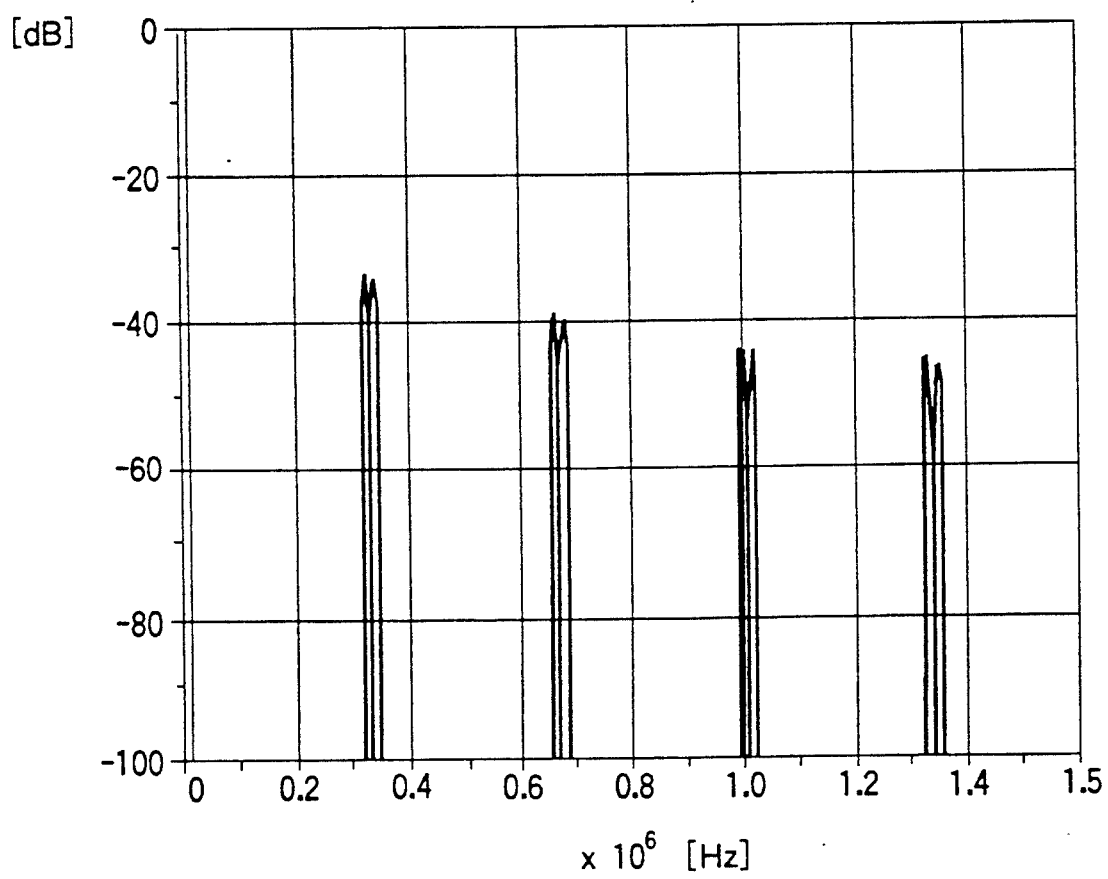
FIG. 3 is a frequency spectrum of an output of a post-filter in the prior art.
Figure 4:
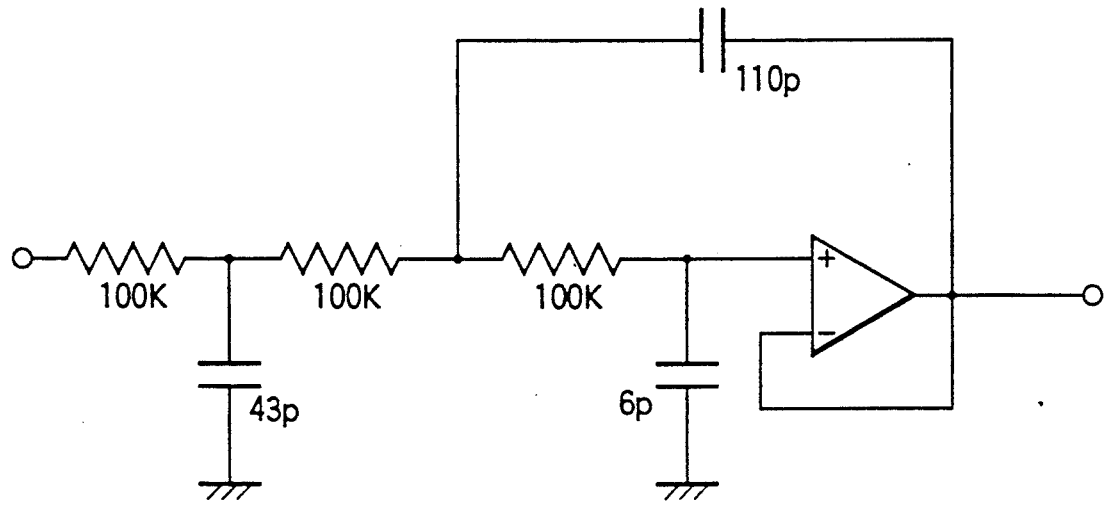
FIG. 4 is a circuit diagram of a post-filter in the prior art.
Figure 5:
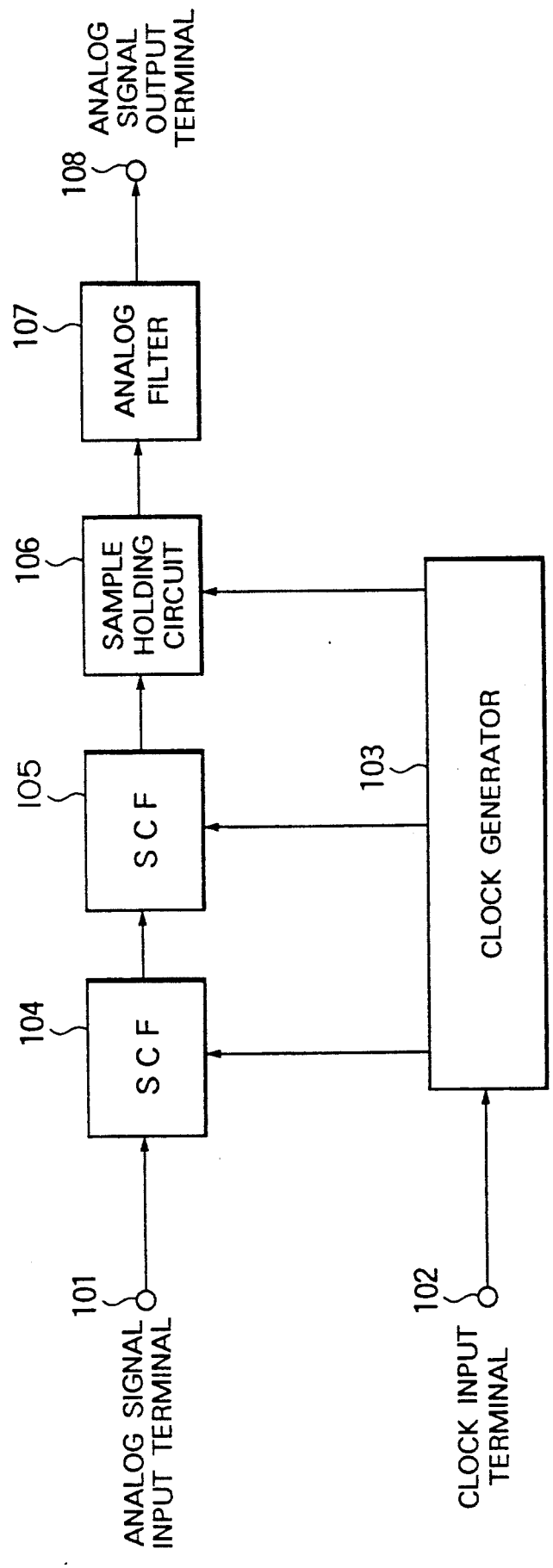
FIG. 5 is a block diagram of an SCF circuit in accordance with an embodiment of the present invention.

Referring first to FIG. 5, there is schematically shown a block diagram of an SCF circuit in accordance with an embodiment of the present invention. In the drawing, reference numeral 101 denotes an analog signal input terminal and numeral 102 denotes a clock input terminal. A clock generator 103, which receives a system clock signal from the clock input terminal 102, is connected to a first SCF 104, a second SCF 105 and a sample holding circuit 106. The first SCF 104 functions to receive an analog signal from the analog signal input terminal 101 and perform its filtering operation. The second SCF 105 interpolates an output of the first SCF 104 with respect to its first order. The sample holding circuit 106 samples and holds an output of the second SCF 105 with respect to the zero order. A low pass type analog filter 107 acts to suppress unnecessary spectra in an output of the sample holding circuit 106. Numeral 108 denotes an analog signal output terminal.

Explanation will next be made as to the operation of the above embodiment. The switched capacitor filter circuit operates in such a manner that its output spectrum has such a route Nyquist characteristic ($\alpha=0.5$) as shown in the following equation (3) with respect to a 21 kHz rectangular pulse train input.

$$H(f) = \begin{cases} 1 & (0 \leq f < 5.25 \text{ k}) \\ \left\{ 0.5 \times \left( 1 - \sin\left[ \pi \left( \frac{f}{10.5 \text{ k}} - 1 \right) \right] \right) \right\}^{0.5} & (5.25 \text{ k} \leq f < 15.75 \text{ k}) \\ 0 & (15.75 \text{ k} < f) \end{cases} \quad (3)$$

In FIG. 5, when a 21 kHz rectangular pulse train is applied to the analog signal input terminal 101, the first SCF 104 samples and takes therein an amplitude value of the analog input signal at sampling intervals of $T_1 = 336$ kHz and performs its filtering operation. An output of the first SCF 104 is interpolated at the second SCF 105 with respect to the first order and then output at sampling intervals of $T_2 = 1.34$ MHz. The power spectrum of the output of the first SCF 104 after being subjected, at the second SCF 104, to the first-order interpolation is expressed by the following equation (4) and also shown in FIG. 6.

$$\| Hz_1(f) \|^2 = \frac{\sin[\pi f]}{\pi f} \times \| H(fs) \|^2 \quad (4)$$

where fs = 336 kHz.

The second SCF 105 calculates the above first-order interpolated signal with the sampling frequency of 1.344 MHz and outputs it. At this time, the level of aliasing noise mixed into the base band is less than −80 dB as will be clear from FIG. 6 and thus this causes no problem. Further the output of the second SCF 105 is subjected at the sample holding circuit 106 to a zero-order holding operation to obtain such an output waveform as shown in FIG. 7.

Figure 6:
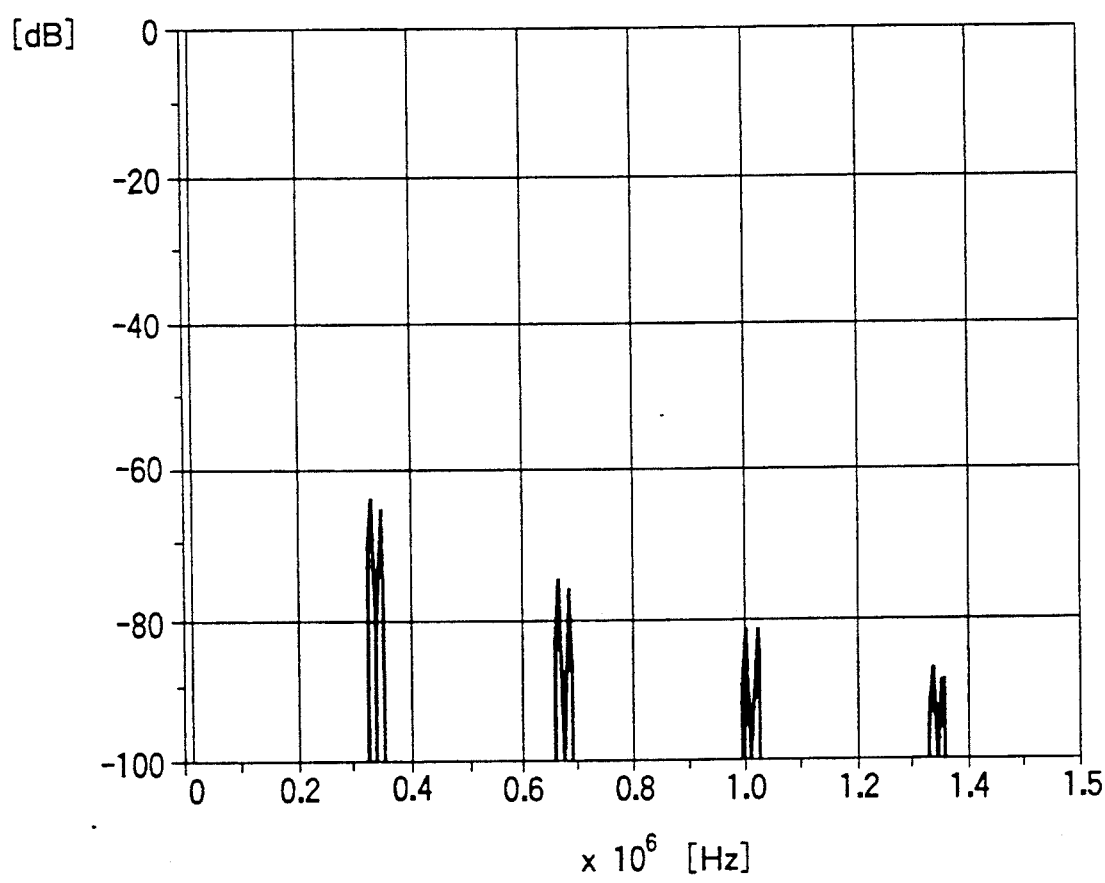
FIG. 6 is a frequency spectrum of a first-order held output of a first SCF in the embodiment.
Figure 7:
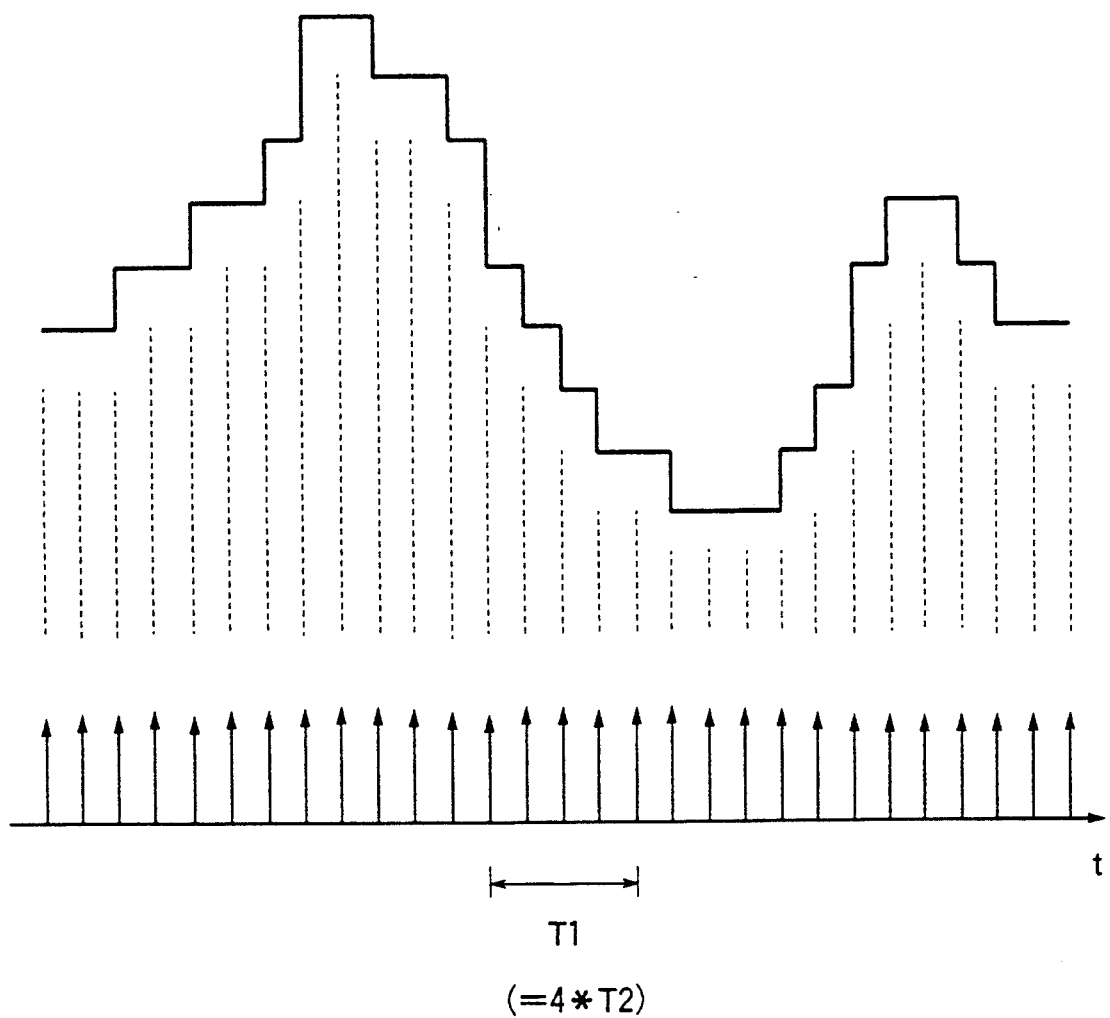
FIG. 7 is a waveform of an output of a post-filter in the embodiment.

In this connection, since unnecessary frequency components corresponding to a multiple of 336 kHz are already suppressed to be less than −60 dB under the influences of the first-order interpolation as shown in FIG. 6, it is just required that the analog filter 107 at the latter stage suppress unnecessary frequency components corresponding to a multiple of the sampling frequency 1.344 MHz of the second SCF 105. To this end, the analog filter 107 comprising a first-order CR filter having a cut-off frequency of 200 kHz suppresses the above unnecessary frequency spectra to be less than −60 dB and outputs it to the analog output terminal 108.

When a system clock signal having a frequency of 5.376 MHz is applied to the clock input terminal 102, the clock generator 103 generates clock signals necessary for the operation of the first and second SCFs 104 and 105 and sample holding circuit 106 on the basis of the system clock signal received from the terminal 102.

Figure 8:
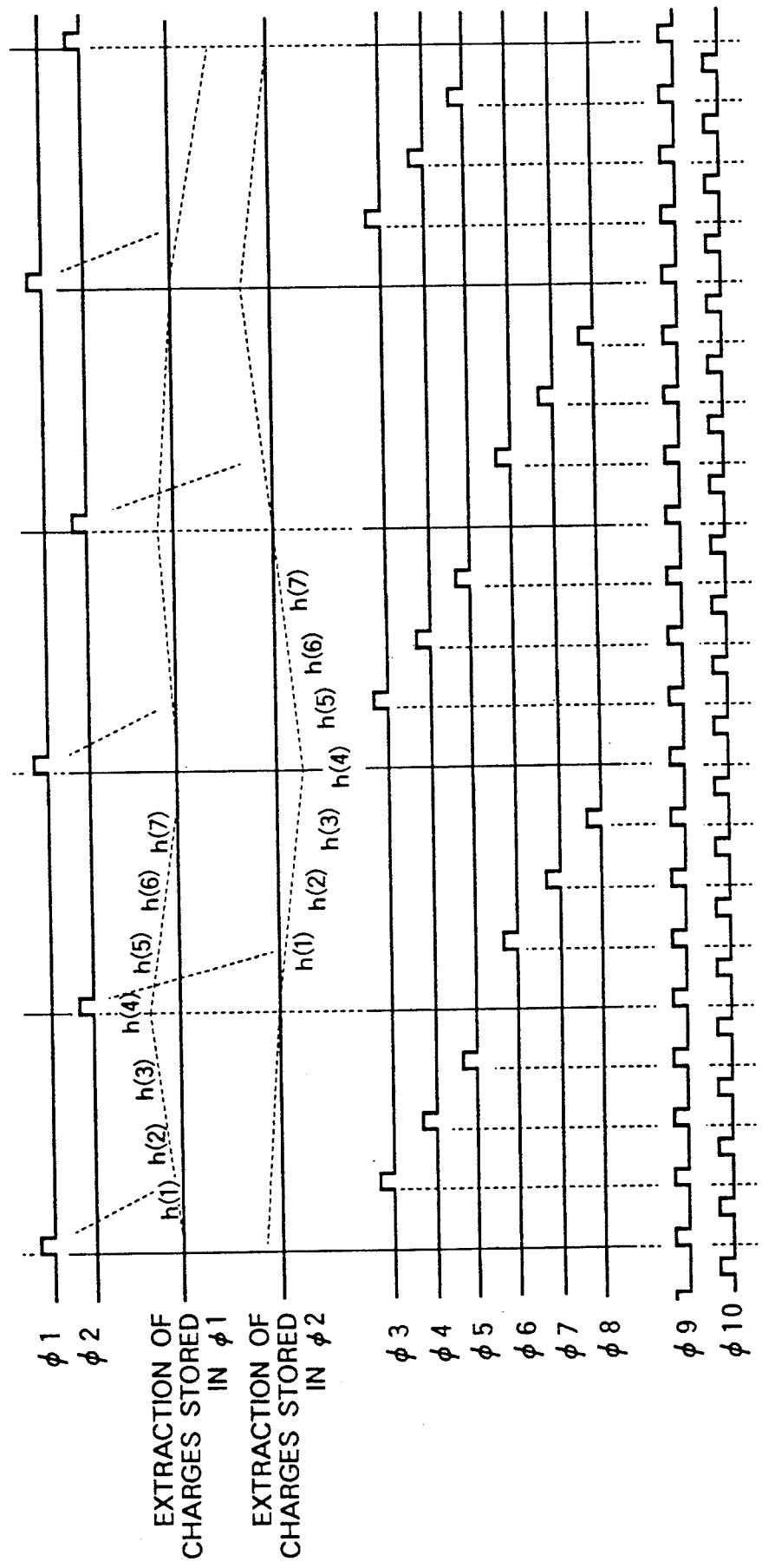
FIG. 8 is a timing chart for explaining the operation of the post-filter in the embodiment.

Shown in FIG. 8 is a timing chart for explaining the operation of the second SCF 105, in which $\phi 1$ and $\phi 2$ denote input clock signals for reception of the output of the first SCF 104, $\phi 3$, $\phi 4$, $\phi 5$, $\phi 6$, $\phi 7$, $\phi 8$ and $\phi 10$ denote control clock signals for computation of a first-order held output for the output of the first SCF 104. The signals $\phi 1$ and $\phi 2$ may be used as the control clocks. Reference symbol $\phi 9$ denotes an output clock of the second SCF 105.

Figure 9:
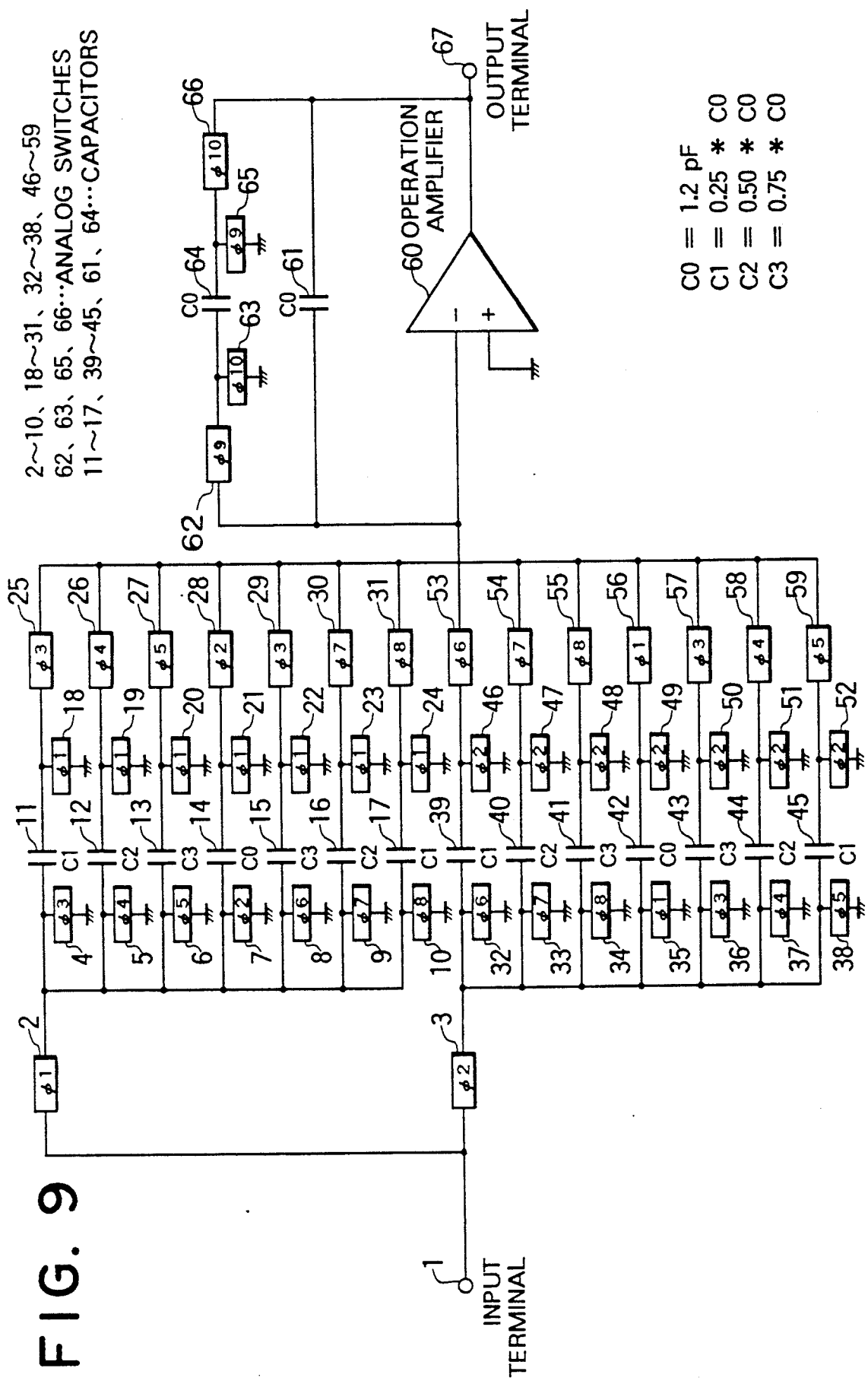
FIG. 9 is a circuit diagram of a second SCF in the embodiment.

Explanation will now be made as to the details of the circuit of the second SCF 105 by referring to FIG. 9. In the drawing, an input terminal 1 is connected to an analog switch 2 for short-circuiting when $\phi 1 = H$ (H = high), and to an analog switch 3 for short-circuiting when $\phi 2 = H$, respectively. Connected to the analog switch 2 are analog switches 4 to 10 and capacitors 11 to 17 which in turn are connected at their other ends with analog switches 18 to 24 and 25 to 31. The analog switches 4 and 25 are short-circuited when $\phi 3 = H$, while the analog switches 5 and 26 are short-circuited when $\phi 4 = H$. The analog switches 6 and 27 are short-circuited when $\phi 5 = H$, the analog switches 7 and 28 are when $\phi 2 = H$, the analog switches 8 and 29 are when $\phi 6 = H$, the analog switches 9 and 30 are when $\phi 7 = H$, and the analog switches 10 and 31 are when $\phi 8 = H$, respectively. The analog switches 18 to 24 are short-circuited when $\phi 1 = H$. Further, the capacitors 11 to 17 have capacitances of 0.3 pF, 0.6 pF, 0.9 pF, 1.2 pF, 0.9 pF, 0.6 pF and 0.3 pF, respectively.

The analog switch 3 is connected with analog switches 32 to 38 and capacitors 39 to 45 which in turn are connected at their other ends with analog switches 46 to 52 and 53 to 59. The analog switches 32 and 53 are short-circuited when $\phi 6 = H$, while the analog switches 33 and 54 are short-circuited when $\phi 7 = H$. The analog switches 36 and 57 are short-circuited when $\phi 3 = H$, the analog switches 37 and 58 are when $\phi 4 = H$, and the analog switches 38 and 59 are when $\phi 5 = H$, respectively. The analog switches 46 to 52 are short-circuited when $\phi 2 = H$. Further, the capacitors 39 to 45 have capacitances of 0.3 pF, 0.6 pF, 0.9 pF, 1.2 pF, 0.9 pF, 0.6 pF and 0.3 pF, respectively.

The analog switches 25 to 31 and 53 to 59 are all connected at their other ends to an input terminal of an operational amplifier 60. Connected between the input and output sides of the operational amplifier 60 is a capacitor 61 to which analog switches 62 and 63, a capacitor 64 and analog switches 65 and 66 are in parallel. Also connected to the output side of the operational amplifier 60 is an output terminal 67. The analog switches 62 and 65 are short-circuited when $\phi 9 = H$, while the analog switches 63 and 66 are short-circuited when $\phi 10 = H$. The capacitors 61 and 64 have each a capacitance of 1.2 pF.

Figure 10:
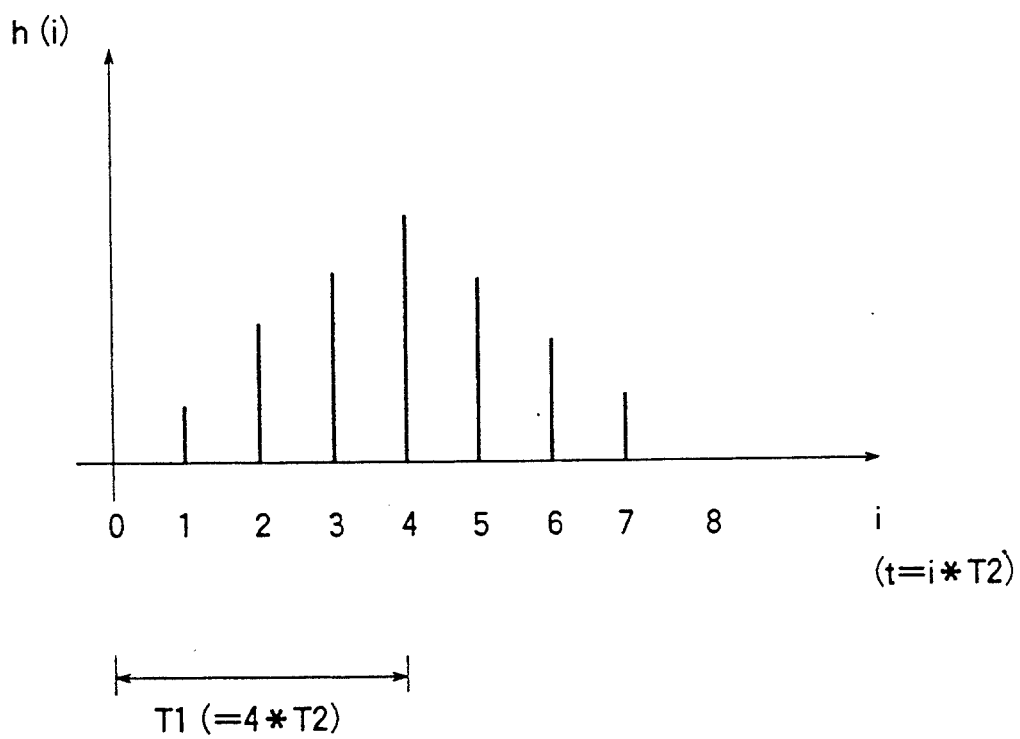
FIG. 10 is an impulse response diagram of the post-filter in the embodiment.

Next, the operation of the second SCF 105 will be explained with reference to FIGS. 8, 9 and 10. In FIG. 9, first, when the output of the first SCF 104 (varying at the sampling interval $T_1 = 336$ kHz) applied to the input terminal 1, the applied input signal is alternately received in according to the clock signals $\phi 1$ and $\phi 2$. When $\phi 1 = H$, the analog switches 2 and 18 to 24 are short-circuited to simultaneously charge the capacitors 11 to 17. Similarly, when $\phi 2 = H$, the analog switches 3 and 46 to 52 are short-circuited to simultaneously charge the capacitors 39 to 45, respectively. Since the capacitive values of these two sets of capacitors are weighted according to impulse responses of the non-recursive filter performing its first-order interpolating operation, as shown in FIG. 10, seven impulse response samples (corresponding to h(1) to h(7) since h(0)=h(8)=0 in FIG. 10) are stored in the form of charges in response to sample input. When $\phi 3 = H$, the analog switches 4, 25, 36 and 57 are short-circuited to additionally charge the capacitors 11 and 43, which charges are extracted in the form of an output voltage of the operational amplifier 60. The present circuit, which is an integrated circuit, acts to subtract the one-sample-previous output stored in the capacitor 64 during the above addition execution, that is, to perform its non-recursive filtering operation. The capacitor 64 is charged when $\phi 10 = H$.

In the similar way to the above, when $\phi 4$-H, the analog switches 5, 26, 37 and 58 are short-circuited to additionally charge the capacitors 12 and 44, with the result that the charges are extracted in the form of an output voltage of the operational amplifier 60.

When $\phi 5 = H$, the analog switches 6, 27, 38 and 59 are short-circuited to additionally charge the capacitors 13 and 45, the charges are extracted in the form of an output of the operational amplifier 60.

When $\phi 2 = H$, the analog switches 7 and 28 are short-circuited to charge the capacitor 14, the charges are extracted in the form of an output of the operational amplifier 60.

When $\phi 6 = H$, the analog switches 8, 29, 32 and 53 are short-circuited to additionally charge the capacitors 15 and 39, the charges are extracted in the form of an output of the operational amplifier 60.

When $\phi 7 = H$, the analog switches 9, 30, 33 and 54 are short-circuited to additionally charge the capacitors 16 and 40, the charges are extracted in the form of an output of the operational amplifier 60.

When $\phi 8 = H$, the analog switches 10, 31, 34 and 55 are short-circuited to additionally charge the capacitors 17 and 41, the charges are extracted in the form of an output of the operational amplifier 60.

When $\phi 1 = H$, the analog switches 35 and 56 are short-circuited to charge the capacitor 42, the charges are extracted in the form of an output of the operational amplifier 60.

Through the above operations, the second SCF 105 sequentially computes a 1.344 MHz sample signal when the 336 kHz sampling input is first-order-held.

In this way, in accordance with the foregoing embodiment, when the first-order-held sample signal in the output of the first SCF 104 is obtained through the second SCF 105 operated at a sampling frequency corresponding to four times the original sampling frequency, unnecessary frequency components corresponding to a multiple of 336 kHz can be suppressed, which results in that the pass frequency order of the analog filter at the final stage can be reduced and no adjustment of the circuit can be realized.

Although the sampling frequency of the first SCF 104 has been set at 336 kHz in the foregoing embodiment, an increase in the number of capacitors used in the second SCF 105 may allow the first SCF 104 to be operated at a sampling frequency lower than 336 kHz, in which case a reduction in the power consumption of the first SCF 105 can be realized.

Further, the second SCF 105 has been arranged to perform only its first-order interpolating operation in the foregoing embodiment, but a change in the capacitive value of each of the capacitors used in the second SCF 105 may allow the second SCF 105 to perform a higher-order interpolating operation. In addition, when the number of capacitors used in the second SCF 105 is increased, the second SCF 105 may simultaneously perform both the first-order interpolating operation and the low pass filtering operation. In these cases, unnecessary frequency components corresponding to a multiple of 336 kHz can be reduced.

What is claimed is:

1. A switched capacitor filter circuit comprising:
   (a) a first switched capacitor filter for sampling an input analog signal at a sampling interval $T_1$ and for outputting a first sampled output signal;
   (b) a second switched capacitor filter, receiving said first sampled output signal, for performing a non-recursive filtering operation on said first sampled output signal and for outputting a second sampled output signal at a second sampling interval $T_1/n$, said second switched capacitor filter comprising:
      (i) m parallel-connected branches, each of said branches including a predetermined number of parallel-connected capacitors,
      (ii) first means for sequentially selecting said branches at said sampling interval $T_1$ and for simultaneously providing said capacitors of each one of said branches, when it is selected, with said first sampled output signal,
      (iii) second means for selecting, at a time when said branches are being sequentially selected by said first means, each of said capacitors of ones of said branches other than one of said branches which is currently being selected by said first means,
      (iv) third means for sequentially selecting at said second sampling interval $T_1/n$, at a time when said branches are not being selected by said first means, one of said capacitors of each of said branches, so as to select m capacitors in each sequential selection,
      (v) fourth means for weighting sampled values stored by said capacitors selected by said second means and said capacitors selected by said third means in accordance with ratios of capacitance values of said capacitors selected by said second means and said capacitors selected by said third means and an integrating capacitor, and
      (vi) fifth means for obtaining a sum of weighted sampled values provided by said fourth means and for outputting said sum of said weighted sampled values as said second sampled output signal at said second sampling interval $T_1/n$; and
   (c) a low pass analog filter, connected to said second switched capacitor filter, for suppressing unnecessary components of said second sampled output signal having frequency multiples of $n/T_1$.

* * * * *